(12) United States Patent
Curlee

(10) Patent No.: US 6,256,191 B1
(45) Date of Patent: Jul. 3, 2001

(54) CARD RETENTION APPARATUS FOR A COMPUTER SYSTEM

(75) Inventor: James Don Curlee, Round Rock, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/314,729

(22) Filed: May 18, 1999

(51) Int. Cl.[7] .................................................. H05K 5/00
(52) U.S. Cl. .................... 361/683; 361/679; 361/684; 361/686; 361/736; 361/740; 361/748; 361/785; 361/787
(58) Field of Search ..................................... 361/679, 683, 361/684, 686, 736, 740, 748, 785, 787

(56) References Cited

U.S. PATENT DOCUMENTS

| 5,317,483 | 5/1994 | Swindler . |
|---|---|---|
| 5,601,349 | 2/1997 | Holt . |
| 5,640,309 | 6/1997 | Carney et al. . |
| 5,642,263 | 6/1997 | Lauruhn . |
| 5,680,296 | 10/1997 | Hileman et al. . |
| 5,706,173 | 1/1998 | Carney et al. . |
| 5,715,146 | 2/1998 | Hoppal . |
| 5,761,030 | 6/1998 | Roscoe . |
| 6,017,004 | * 1/2000 | Grantham ........................... 248/27.3 |

\* cited by examiner

Primary Examiner—Leo P. Picard
Assistant Examiner—Yean-Hsi Chang
(74) Attorney, Agent, or Firm—Haynes and Boone, LLP

(57) ABSTRACT

A card retention apparatus has an enclosure including an attachable cover. A connector having a card seated in the connector is mounted in the enclosure. A card retaining member is connected to extend from the enclosure into contact with the card. The card retaining member urges the card into seated engagement with the connector. A resilient member is mounted between the card retaining member and the cover for providing a retention force. The card retaining member is engaged with the card and moved into a biased position when the cover is mounted onto the enclosure, the movement to the biased position acting on the spring to establish a retention force that is applied on the card.

28 Claims, 3 Drawing Sheets

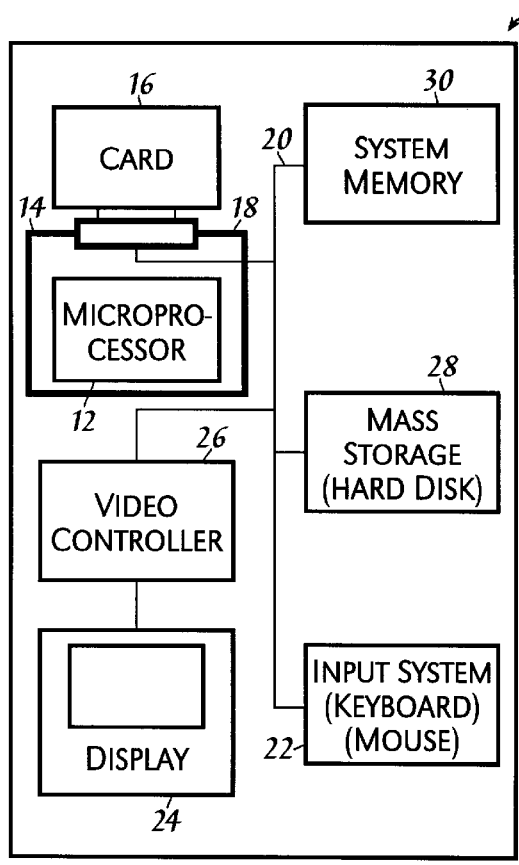
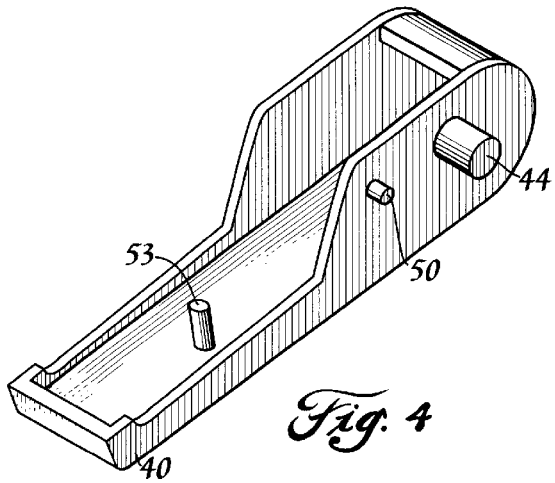
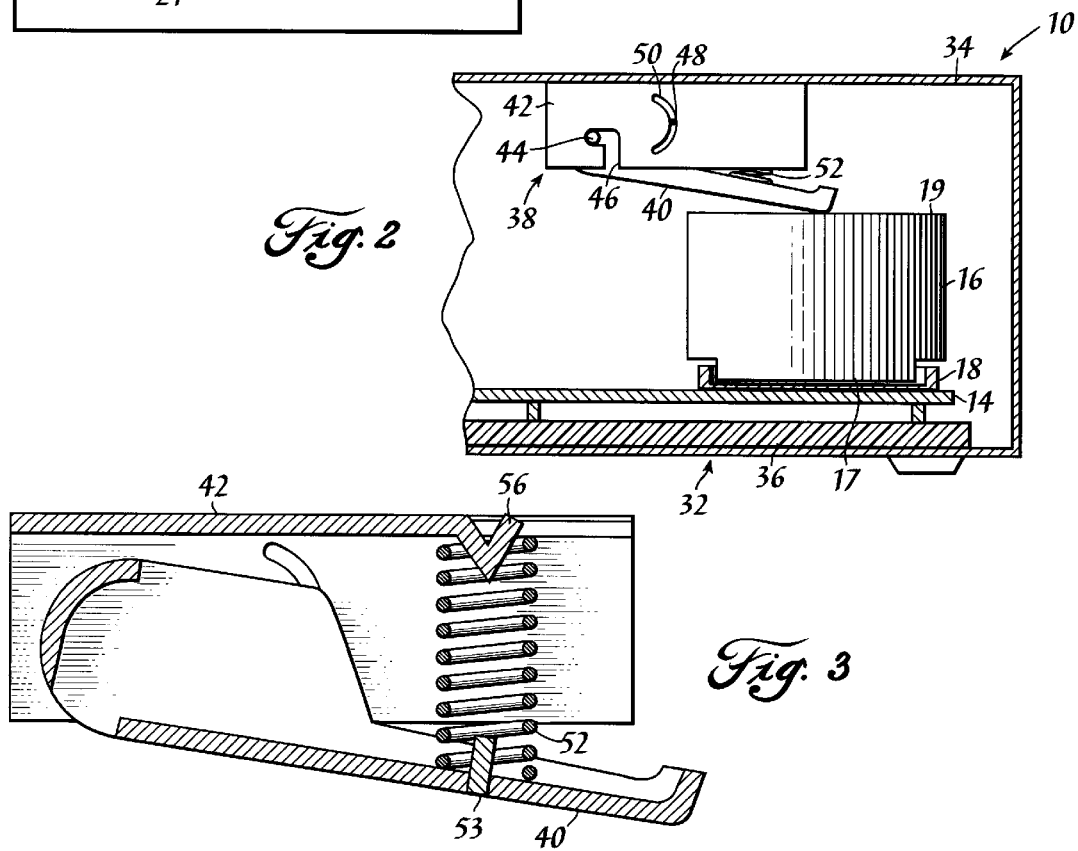

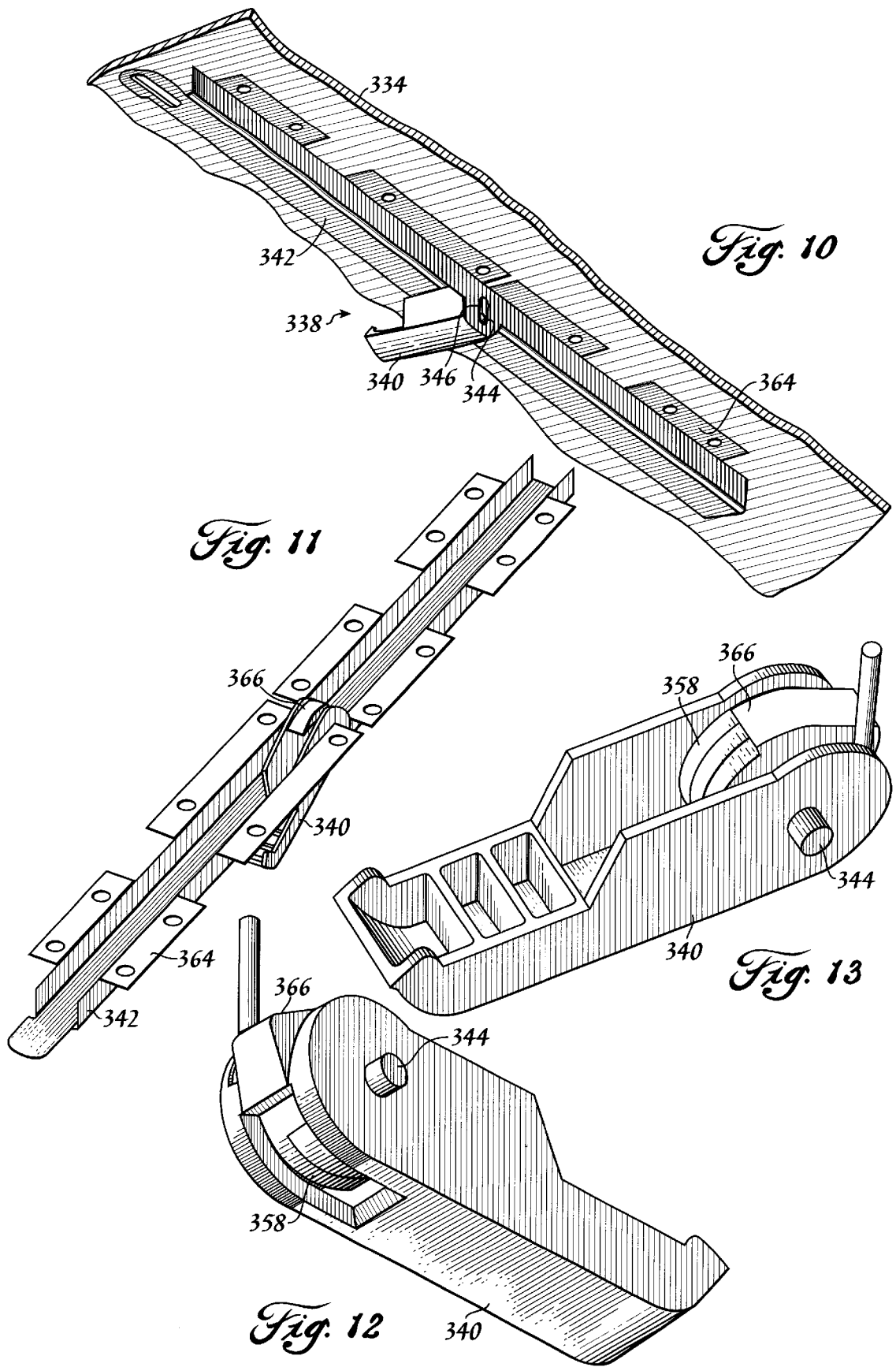

CARD RETENTION APPARATUS FOR A COMPUTER SYSTEM

BACKGROUND

The disclosures herein relate generally to computer systems and more particularly to retention apparatus for retaining removable cards in computers.

Current AGP video cards and PCI expansion cards have the tendency to become unseated during shipping and during handling of the computer in the manufacturing process. This problem is an industry wide issue due to the design of the current AGP video card connector and mating cards. Removable cards of various types will hereinafter be referred to as cards.

When a card becomes unseated from the connector after the computer is shipped, the computer fails to operate properly when the purchaser initiates use. This is an out of the box failure typically resulting in the purchaser having to contact the manufacturer to rectify the problem. This is a costly inconvenience to both the purchaser and the manufacturer. When a card becomes unseated from the connector during manufacturing due to handling of the computer, the computer fails to operate properly when being tested by the manufacturer. These failures reduce the manufacturer's productivity and profitability.

U.S. Pat. No. 5,680,296 to Hileman et al discloses a card guide that both restrains an installed electronic card and allows the card to be inserted into a computer chassis in a direction that is parallel to the motherboard of the computer. The card guide extends from a beam that is cantilevered from a frame of a computer chassis. The card guide has a groove that guides an edge of the electronic card so that the card is aligned with a connector of the motherboard. The card guide also has a ramp that guides the card into the groove in a direction parallel with the motherboard and perpendicular to the groove. The card is installed by initially pushing the electronic card along the ramp until the edge of the card snaps into the groove. The cantilevered beam is deflected by the installation force of the user to allow the card to move down the ramp. Once in the groove, the electronic card is pushed in a direction perpendicular to the motherboard to plug the card into the motherboard connector.

U.S. Pat. No. 5,706,173 to Carney et al discloses an apparatus in which an edge of a long PCI card plugs into a connector at one end of a computer enclosure. The opposite end extends into the enclosure and may be superimposed over a component such as a disk drive. A support is rigidly mounted on the enclosure to fit under the inner end of the card. A slide on the support grips the inner end of the card. The slide is adjustably positioned on the support to accommodate cards of different lengths.

U.S. Pat. No. 5,317,483 to Swindler et al discloses a sheet metal support cage structure within a computer. The cage has an inturned side wall ledge portion and removably receives a spaced series of expansion cards. Extending along edge portions of the cards that face the ledges are sheet metal mounting brackets having outwardly bent end tab portions that overlie and engage the side wall ledge. The tabs are removably held in place on the ledge by an elongated hold-down bar secured at an inner end thereof to the cage structure. This arrangement provides for pivotal movement of the bar between a closed position and an open position.

These references disclose apparatus for mounting and securing cards of various types in connectors. The references disclose retention apparatus wherein hand manipulation is required to either engage or disengage the apparatus. Furthermore, at least one of the apparatus disclosed in the references requires a different construction for each different card size.

Accordingly, a need has arisen for an apparatus for retaining cards in connectors that overcomes the shortcomings of previous apparatus, and in particular for an apparatus that is simple, inexpensive and effective for retaining cards in connectors. A retention apparatus according to this disclosure will not require hand manipulation to engage or disengage the apparatus. It will also automatically adjust to accommodate different size cards.

SUMMARY

One embodiment, accordingly, provides a card retention apparatus that is in combination with the enclosure of a computer and constructed such that it does not require hand manipulation to engage or disengage the apparatus. The card retention apparatus applies a force to hold the card in place, thereby preventing the card from unseating during shipping or during handling in the manufacturing process. To this end, a card retention apparatus has an enclosure including an attachable cover. A connector having a card seated therein is mounted in the enclosure. A card retaining member is connected to extend from the enclosure into contact with the card. The card retaining member urges the card into seated engagement with the connector.

A principal advantage of this embodiment is that the engagement and disengagement of the card retention apparatus is transparent to an individual removing the cover and servicing the card. The apparatus does not need to be manually engaged or disengaged. Another principal advantage is that the card retention apparatus will automatically adjust to accommodate different size expansion cards. Yet another advantage is that the retention apparatus is simple, yet effective without being costly to make or install.

BRIEF DESCRIPTION OF THE DRAWING FIGURES

FIG. 1 is a block diagram of an illustrative embodiment of a computer system.

FIG. 2 is a fragmentary side view showing an illustrative embodiment of a card retention apparatus wherein the card retaining member is mounted on the cover of the enclosure.

FIG. 3 is a cross sectional view showing an illustrative embodiment of a card retention apparatus wherein the retention force applied on the card is provided by a compression spring.

FIG. 4 is a perspective view showing an illustrative embodiment of a card retaining member.

FIG. 10 is a perspective view showing an illustrative embodiment of a card retaining member having a stop for limiting the rotation of the card retaining member.

FIG. 11 is a perspective view showing the top of the illustrative embodiment of FIG. 10.

FIG. 12 is a perspective view showing bottom of the card retaining member shown in FIG. 11.

FIG. 13 is a perspective view showing top of the card retaining member shown in FIG. 11.

DETAILED DESCRIPTION

Figure 5:
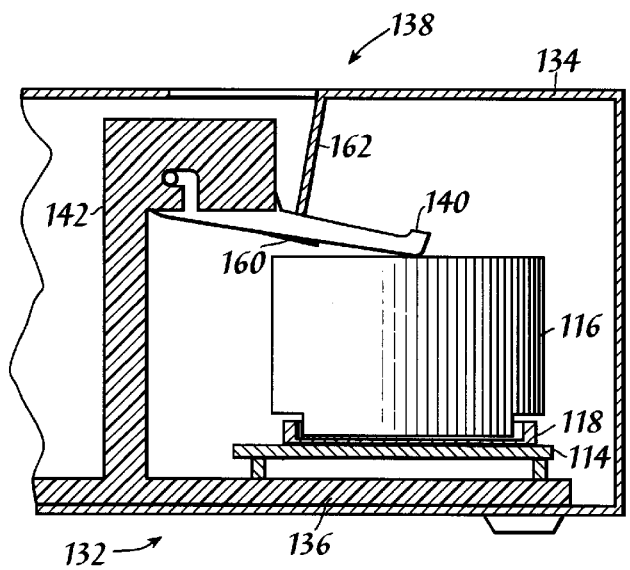
FIG. 5 is a fragmentary side view showing an alternate illustrative embodiment of a card retention apparatus wherein the card retaining member is mounted on the chassis.

In one embodiment, FIG. 1 shows a block diagram of a computer system, indicated generally at 10. The computer system 10 includes a microprocessor 12 mounted on a printed circuit board 14 (hereinafter referred to as a PCB). The microprocessor 12 and a card 16 are connected to a bus 20. The card 16 is connected to the bus 20 through connector 18 which is mounted to the PCB 14. The bus 20 serves as a connection between the microprocessor 12, the card 16 and other components of the computer system 10. An input system 22 is coupled to the microprocessor 12 to provide input to the microprocessor 12. Examples of input apparatus include keyboards, touchscreens, and pointing apparatus such as mouses, trackballs, and trackpads. The computer system 10 further includes a display 24 which is coupled to the microprocessor 12 typically by a video controller 22. Programs and data are stored on a mass storage device 28 which is coupled to the microprocessor 12. Mass storage devices include components such as hard disks, optical disks, magneto-optical drives, floppy drives, and the like. The system memory 30 provides the microprocessor 12 with fast storage to facilitate execution of computer programs by the microprocessor 12. It should be understood that other busses and intermediate circuits can be employed between the components described above and microprocessor 12 to facilitate interconnection between the components and the microprocessor.

Referring now to FIG. 2, the computer system 10 includes an enclosure 32 that includes a cover 34. A card 16 is connected to the PCB 14 via a plug-in type connector 18. The connector is mounted to the PCB 14 for providing electrical interconnection to other system components and subsystems. The card 16 is positioned in a vertical orientation such that it is easily accessible when the cover 34 is removed. The card 16 has a mountable end 17 that is received by the connector 18 and a terminal end 19 opposite the mountable end 17. A chassis 36 may be mounted to the inside of the enclosure 32 with the PCB 14 mounted to the chassis 36. In other computer configurations, the PCB 14 may be mounted directly to the enclosure 32.

A card retention apparatus 38 (FIG. 2) is provided for preventing the card 16 from becoming unseated from the connector 18 during shipping or during the manufacture of the computer system 10. The card retention apparatus 38 includes a card retaining member 40 such as a rocker arm that resiliently engages the terminal end 19 of the card 16 to prevent it from coming unseated during typical shipping and manufacturing conditions. The card retaining member 40 is pivotably attached to a bracket 42. The bracket 42 may be preformed and attached to the cover 34 or it may be formed directly into the cover 34. It is contemplated that the card retaining member 40 may be made from plastic, metal or any other suitable material. However, the card retention apparatus 38 needs to be constructed such that the card 16 is not conductively coupled to the enclosure 32 or the chassis 36 through the card retention apparatus 38. For this reason, it is preferred that the card retaining member 40 is made from a non-conductive material such as plastic.

The card retaining member 40 includes structural elements such as pivot pins 44 that are received in pivot pin slots 46 (FIG. 2) in the bracket 42, enabling it to pivot relative to the bracket 42. The card retaining member 40 and bracket 42 may also include structural elements such as guide pins 48 that are received in guide slots 50 for guiding the movement of the card retaining member 40 and limiting its extension when the cover 34 is removed. A retention force for maintaining the card 16 in a seated position is provided by a resilient member such as compression spring 52. The compression spring 52 is coupled between the card retaining member 40 and the bracket 42. The compression spring 52 is held in place by spring posts 54, 56 (FIGS. 3 and 4) The compression spring 52 may optionally be coupled between the card retaining member 40 and the cover 34.

Figure 6:
FIG. 6 is a perspective view showing an illustrative embodiment of a card retaining member having an integral spring member.
Figure 7:
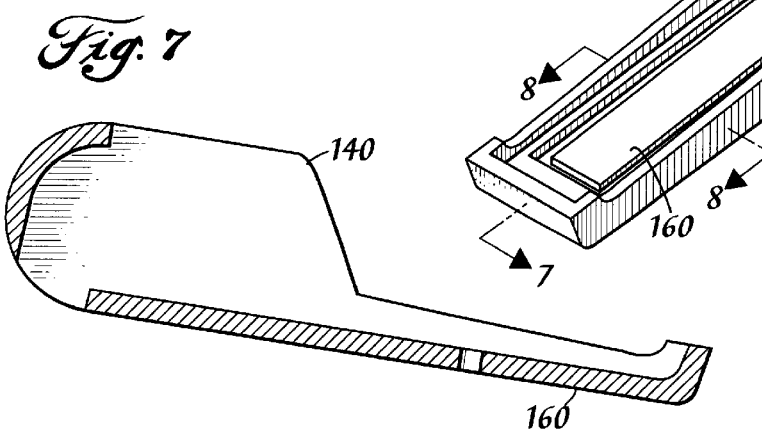
FIG. 7 is a cross sectional view showing section 7—7 as indicated in FIG. 6.
Figure 8:
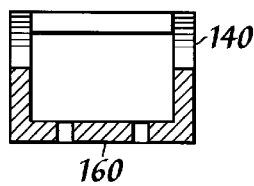
FIG. 8 is a cross sectional view showing section 8—8 as indicated in FIG. 6.
Figure 9:
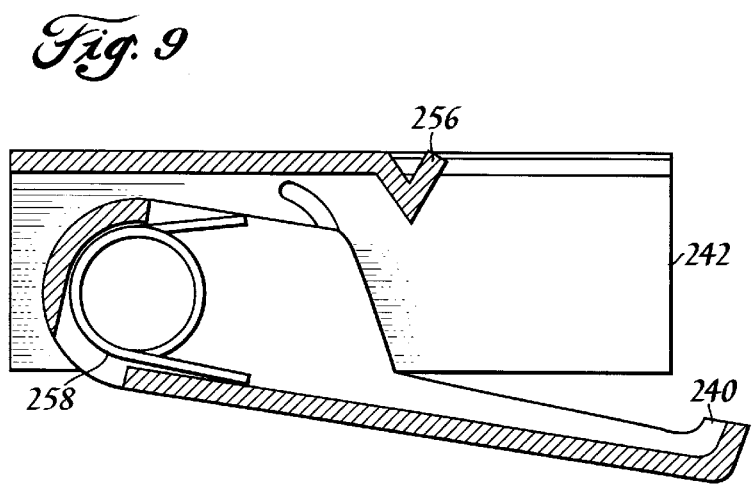
FIG. 9 is a cross sectional view showing an illustrative embodiment of a card retention apparatus wherein the retention force applied on the card is provided by a torsion spring.

FIGS. 5–8 show an illustrative embodiment of the card retention apparatus 138 wherein the card retaining member 140 is pivotably attached to a bracket 142. The bracket 142 is shown attached to the chassis 136. In an alternate configuration, the bracket 142 could be attached to the enclosure 132. In this embodiment, the card retaining member 140 includes a resilient member in the form of an integral spring member 160 (FIG. 6). The spring member 160 is contacted and deflected by a flange 162 that is part of the cover 134. Once the spring retention member 140 is engaged against the card 116, the spring member 160 deflects and a retention force for maintaining the card 116 in seated engagement with the connector 118 is established. The farther the spring member 160 is deflected, the greater the retention force will be.

Referring to FIGS. 10–13, an illustrative embodiment of a card retention apparatus 336 is shown having a stop 366 for limiting the travel of the card retaining member 340 when the cover of the enclosure is removed or when a card is not present under the card retaining member 340. The bracket 342 is attached to the cover 334 at the flanges 364 using a technique such as welding, adhesive, threaded fasteners, or other known techniques. A card retaining member 340 is mounted in the bracket 342 by pivot pins 344 that are received by pivot pin slots 346 in the bracket 342. The stop 366 is configured to engage against the cover 334 as the torsion spring 358 acts to move itself to an unloaded position. Since the stop 366 limits the rotation of the card retaining member 340, the torsion spring 358 may be maintained in a pre-loaded position. Pre-loading of the torsion spring 358 (or any type of resilient member) may to desirable to provide a given load on a card for a specified amount of travel of the card retaining member 340.

In operation, the illustrative embodiments disclosed herein provide a card retention apparatus having a card retaining member that engages the card and provides a retention force for keeping the card seated in the connector. A resilient member such as a torsion or compression spring is integrated into the card retention apparatus to provide the retention force. The card retaining apparatus is attached to the cover such that it does not need to be manually engaged or disengaged. Installation and removal of the cover automatically engages or disengages, respectively, the apparatus. In an alternate embodiment, the apparatus may be attached to the chassis of the computer. In this embodiment, the installation and removal of the cover engages and disengages, respectively, the apparatus. Also in operation, the card retention apparatus will automatically adjust to accommodate different size cards.

As a result, one embodiment provides a card retention apparatus including an enclosure having a cover attachable thereon. A connector having a card seated therein is mounted in the enclosure. A card retaining member is connected to extend from the enclosure into contact with the card. The card retaining member urges the card into seated engagement with the connector.

In another embodiment, a computer system has an enclosure including a cover attachable thereon. A connector having a card seated therein is mounted in the enclosure. A microprocessor mounted in the enclosure is coupled to the card and an input is coupled to provide input to the microprocessor. A mass storage is coupled to the microprocessor and a display is coupled to the microprocessor by a video controller. A memory is coupled to provide storage to facilitate execution of computer programs by the microprocessor. A card retaining member is connected to extend from the enclosure into contact with the card. The card retaining member urges the card into seated engagement with the connector.

In yet another embodiment, an apparatus for retaining a card in a connector has an enclosure including a cover attachable thereon. A connector having a card seated therein is mounted in the enclosure. A card retaining means is attached to the enclosure for retaining the card in seated connection with the connector. The card retaining means is attached to the enclosure and extends therefrom into contact with the card, urging the card into seated engagement with the connector.

In a further embodiment, a card retention apparatus includes an enclosure and a connector mounted in the enclosure. The connector is capable of receiving a card. The card has a terminal end opposite an end mountable in the connector. A card retaining member is resiliently connected to extend from the enclosure to a position proximate a location corresponding to the terminal end of the card mountable in the connector. The card retaining member urges the card into seated engagement with the connector when the card is seated in the connector.

In still a further embodiment, a method for retaining a card in a connector includes providing an enclosure with a cover attachable thereon; mounting in the enclosure a connector having a card seated therein; attaching a card retaining member to the cover; and attaching the cover onto the enclosure. The card retaining member is resiliently connected to extend from the cover, urging the card into seated engagement with the connector.

As it can be seen, the principal advantages of these embodiments are that the engagement and disengagement of the card retention apparatus is transparent to an individual removing the cover and servicing the card. The apparatus does not need to be manually engaged or disengaged. Another principal advantage is that the card retention apparatus will automatically adjust to accommodate different size expansion cards. Yet another advantage is that the retention apparatus is simple, yet effective without being costly to make or install.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A card retention apparatus for a computer system comprising:

an enclosure;

a connector having a card seated therein mounted in the enclosure;

a card retaining member connected to extend from the enclosure into contact with the card, the card retaining member urging the card into seated engagement with the connector;

the enclosure further includes a cover and a resilient member is coupled between the card retaining member and the enclosure for providing a retention force applied on the card; and the card retaining member is pivotally attached to the cover.

2. The apparatus of claim 1 wherein the resilient member is a torsion-type spring.

3. The apparatus of claim 1 wherein the resilient member is a compression-type spring.

4. The apparatus of claim 1 wherein the card retaining member is engaged against the card and moved into a biased position when the cover is mounted onto the enclosure, the movement to the biased position acting on the resilient member to establish a retention force that is applied on the card.

5. The apparatus of claim 1 wherein the card retaining member is a rocker arm.

6. The apparatus of claim 1 wherein the card retaining member includes an integral spring member and wherein the cover includes a flange that deflects the spring member for establishing a retention force.

7. The apparatus of claim 1 wherein the enclosure further includes a chassis mounted thereto, the card retaining member being mounted to the chassis.

8. The apparatus of claim 7 further including a resilient member coupled between the card retaining member and the chassis for providing a retention force.

9. The apparatus of claim 7 wherein the card retaining member is resiliently mounted to the chassis thereby establishing a retention force applied to the card, the retention force maintaining the card in seated engagement with the connector.

10. The apparatus of claim 7 wherein the chassis includes a bracket, the card retaining member being attached to the bracket.

11. The apparatus of claim 10 wherein the enclosure includes a cover, wherein the card retaining member includes an integral spring member and wherein the cover deflects the spring member for establishing a retention force.

12. The apparatus of claim 1 wherein the cover includes a bracket, the card retaining member being attached to the bracket.

13. A computer system comprising:

an enclosure including a cover attachable thereon;

a connector having a card seated therein mounted in the enclosure;

a microprocessor mounted in the enclosure coupled to the card;

an input coupled to provide input to the microprocessor;

a mass storage coupled to the microprocessor;

a display coupled to the microprocessor by a video controller;

a memory coupled to provide storage to facilitate execution of computer programs by the microprocessor;

a card retaining member connected to extend from the enclosure into contact with the card, the card retaining member urging the card into seated engagement with the connector; and the card retaining member is pivotally attached to the cover.

14. The computer system of claim 13 wherein a resilient member is coupled between the card retaining member and the cover.

15. The computer system of claim 14 wherein the card retaining member is engaged with the card and moved into a biased position when the cover is mounted onto the enclosure, the movement to the biased position acting on the spring to establish a retention force that is applied on the card.

16. The computer system of claim 14 wherein the resilient member is a torsion-type spring.

17. The computer system of claim 14 wherein the spring is a compression-type spring.

18. The computer system of claim 14 wherein the retaining member is a rocker arm.

19. The computer system of claim 13 wherein the card retaining member includes an integral spring member and the cover deflects the spring member for establishing a retention force.

20. The computer system of claim 13 wherein the enclosure further includes a chassis mounted thereto, the card retaining member being mounted to the chassis.

21. The computer system of claim 20 further including a resilient member coupled between the card retaining member and the chassis.

22. The computer system of claim 21 wherein the resilient member is a spring member integral with the card retaining member and wherein the cover includes a flange that deflects the spring member for establishing a retention force.

23. The computer system of claim 20 wherein the chassis includes a bracket, the card retaining member being attached to the bracket.

24. A computer system comprising:
    an enclosure including a cover attachable thereon;
    a connector having a card seated therein mounted in the enclosure;
    a microprocessor mounted in the enclosure coupled to the card;
    an input coupled to provide input to the microprocessor;
    a mass storage coupled to the microprocessor;
    a video controller coupled to the microprocessor;
    a memory coupled to provide storage to facilitate execution of computer programs by the microprocessor;
    a card retaining member connected to extend from the enclosure into contact with the card, the card retaining member urging the card into seated engagement with the connector; and
    the cover includes a bracket, the card retaining member being attached to the bracket.

25. In a computer system, a card retention apparatus comprising:
    an enclosure including a cover attachable thereon;
    a connector having a card seated therein mounted in the enclosure; and
    means pivotally attached to the cover for retaining the card in seated connection with the connector, said means being attached to the enclosure and extending therefrom into contact with the card, the means for retaining urging the card into seated engagement with the connector.

26. A computer system card retention apparatus comprising:
    an enclosure including a cover attachable thereon;
    a connector mounted in the enclosure, the connector being capable of receiving a card therein, the card having a terminal end opposite an end mountable in the connector; and
    a card retaining member pivotally attached to the cover and resiliently connected to extend from the enclosure to a position proximate a location corresponding to the terminal end of the card mountable in the connector, the card retaining member urging the card into seated engagement with the connector when the card is seated in the connector.

27. A method for retaining a card in a connector comprising the steps of:
    providing an enclosure with a cover attachable thereon;
    mounting in the enclosure a connector having a card seated therein;
    pivotally attaching a card retaining member to the cover, the card retaining member being resiliently connected to extend from the cover in alignment with the card; and
    attaching the cover onto the enclosure whereby the card retaining member urges the card into seated engagement with the connector.

28. The method of claim 27 wherein the step of attaching the cover onto the enclosure includes the step of compressing the card retaining member between the card and the cover, the card retaining member being compressed into a biased position whereby a retention force is applied to the card.

* * * * *